US012132077B2

(12) United States Patent
Liu

(10) Patent No.: US 12,132,077 B2
(45) Date of Patent: Oct. 29, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 325 days.

(21) Appl. No.: 17/648,544

(22) Filed: Jan. 20, 2022

(65) Prior Publication Data

US 2022/0293718 A1 Sep. 15, 2022

Related U.S. Application Data

(63) Continuation of application No. PCT/CN2021/105372, filed on Jul. 9, 2021.

(30) Foreign Application Priority Data

Mar. 12, 2021 (CN) .......................... 202110267178.2

(51) Int. Cl.
*H10B 12/00* (2023.01)
*H01L 49/02* (2006.01)

(52) U.S. Cl.
CPC ............. *H01L 28/60* (2013.01); *H10B 12/30* (2023.02)

(58) Field of Classification Search
CPC ........ H01L 28/60; H10B 12/30; H10B 12/033
See application file for complete search history.

(56) References Cited

U.S. PATENT DOCUMENTS

| 9,018,733 B1* | 4/2015 | Lee .......................... H01L 28/60 |
| | | 257/532 |
| 10,763,325 B2 | 9/2020 | Kao |
| 2013/0330903 A1* | 12/2013 | Malhotra ................ H01L 28/60 |
| | | 438/396 |
| 2020/0075710 A1 | 3/2020 | Kao |
| 2020/0083317 A1 | 3/2020 | Huang et al. |

FOREIGN PATENT DOCUMENTS

| CN | 107946302 A | 4/2018 |
| CN | 108538822 A | 9/2018 |
| CN | 108987346 A | 12/2018 |
| CN | 113053898 A | 6/2021 |

* cited by examiner

*Primary Examiner* — David Vu
(74) *Attorney, Agent, or Firm* — Syncoda LLC; Feng Ma

(57) ABSTRACT

A semiconductor structure manufacturing method includes: providing a substrate; forming, on the substrate, a stack structure including a sacrificial layer and a support layer which are alternately stacked on each other; forming a capacitance hole in the stack structure; forming a first electrode layer on a side wall and a bottom of each capacitance hole; forming a first dielectric layer on an inner surface of the first electrode layer; forming, on the stack structure, an opening from which the sacrificial layer is exposed, and removing the sacrificial layer through the opening; forming a second dielectric layer on an inner surface of the first dielectric layer and an outer surface of the first electrode layer; and forming a second electrode layer on an inner surface and an outer surface of the second dielectric layer.

9 Claims, 7 Drawing Sheets

SEMICONDUCTOR STRUCTURE AND MANUFACTURING METHOD THEREOF

CROSS-REFERENCE TO RELATED APPLICATION

This is a continuation of International Patent Application No. PCT/CN2021/105372 filed on Jul. 9, 2021, which claims priority to Chinese Patent Application No. 202110267178.2 filed on Mar. 12, 2021. The disclosures of these applications are incorporated by reference herein in their entirety.

BACKGROUND

Dynamic Random-Access Memory (DRAM) is a common semiconductor storage device used in a computer, and consists of many duplicate storage units. As the size of a capacitor of the DRAM decreases, during the capacitor dielectric layer deposition, the deposition rate of an inner capacitor dielectric layer will be less than that of an outer capacitor dielectric layer due to the difference of the space environment such as the internal space, insufficient reaction gas and too slow removal of reaction products, forming a capacitor dielectric layer with a large difference between the inner thickness and the outer thickness.

SUMMARY

This disclosure relates to the field of semiconductor device and manufacturing semiconductor, and more specifically to a semiconductor structure and a manufacturing method thereof.

According to some embodiments, a first aspect of this disclosure provides a method for manufacturing a semiconductor structure, which includes:
providing a substrate;
forming, on the substrate, a stack structure including a sacrificial layer and a support layer which are alternately stacked on one another;
forming a capacitance hole in the stack structure;
forming a first electrode layer on a side wall and a bottom of the capacitance hole;
forming a first dielectric layer on an inner surface of the first electrode layer;
forming, on the stack structure, an opening form which the sacrificial layer is exposed, and removing the sacrificial layer through the opening;
forming a second dielectric layer on an inner surface of the first dielectric layer and an outer surface of the first electrode layer; and
forming a second electrode layer on an inner surface and an outer surface of the second dielectric layer.

According to some embodiments, a second aspect of this disclosure provides a semiconductor structure, which includes:
a substrate;
a first electrode layer located on the substrate;
a first dielectric layer covering an inner surface of the first electrode layer;
a second dielectric layer covering an inner surface of the first dielectric layer and an outer surface of the first electrode layer; and
a second electrode layer covering an inner surface and an outer surface of the second dielectric layer.

According to some embodiments, a third aspect of this disclosure provides a memory, which includes the above semiconductor structure.

The descriptions only summarize the technical solutions of this disclosure. To know the technical means of this disclosure more clearly, and implement according to the contents of the description, the following will describe by combining preferred embodiments of this disclosure and the brief description of the drawings.

BRIEF DESCRIPTION OF THE DRAWINGS

To describe the technical solutions in embodiments of this disclosure more clearly, the accompanying drawings required for describing the embodiments are briefly introduced below. It is apparent that the accompanying drawings in the following description show merely some embodiments of this disclosure, and a person of ordinary skill in the art can still derive other accompanying drawings in embodiments from these accompanying drawings without an inventive effort.

DETAILED DESCRIPTION

In order to facilitate understanding of this disclosure, the following will make a more comprehensive description of this disclosure with reference to relevant drawings. The drawings show preferred embodiments of this disclosure. However, this disclosure may be implemented in many different forms, which are not limited to the embodiments described herein. On the contrary, the purpose of providing these embodiments is to make understanding of the disclosure of this disclosure more thorough and comprehensive.

Unless otherwise defined, all technical and scientific terms used herein have the same meaning as commonly understood by those skilled in the art. Herein, the terms used in the description of this disclosure are for the purpose of describing particular embodiments only and are not intended to be limiting of this disclosure. As used herein, the term "and/or" used in the present disclosure refers to and includes one or any or all possible combinations of multiple associated items that are listed.

In a case where the terms "comprising", "having", and "including" described herein are used, unless a clear qualifier such as "only" and "consisting of" is used, another component cannot be excluded. It is to be understood that a singular form in the specification and appended claims of the present disclosure are also intended to include a plural form, unless other meanings are clearly denoted throughout the present disclosure, and cannot be understood as one in number.

The inner capacitor dielectric layer is thin in thickness and large in curvature, which will cause the inner capacitor dielectric layer to suffer from low breakdown and high electric field leakage. The inner capacitor dielectric layer and the outer capacitor dielectric layer cannot obtain uniform leakage current, which greatly affects the performance of the storage device.

In order to describe the technical solutions according to this disclosure, description is provided below by means of specific embodiments.

Figure 1:
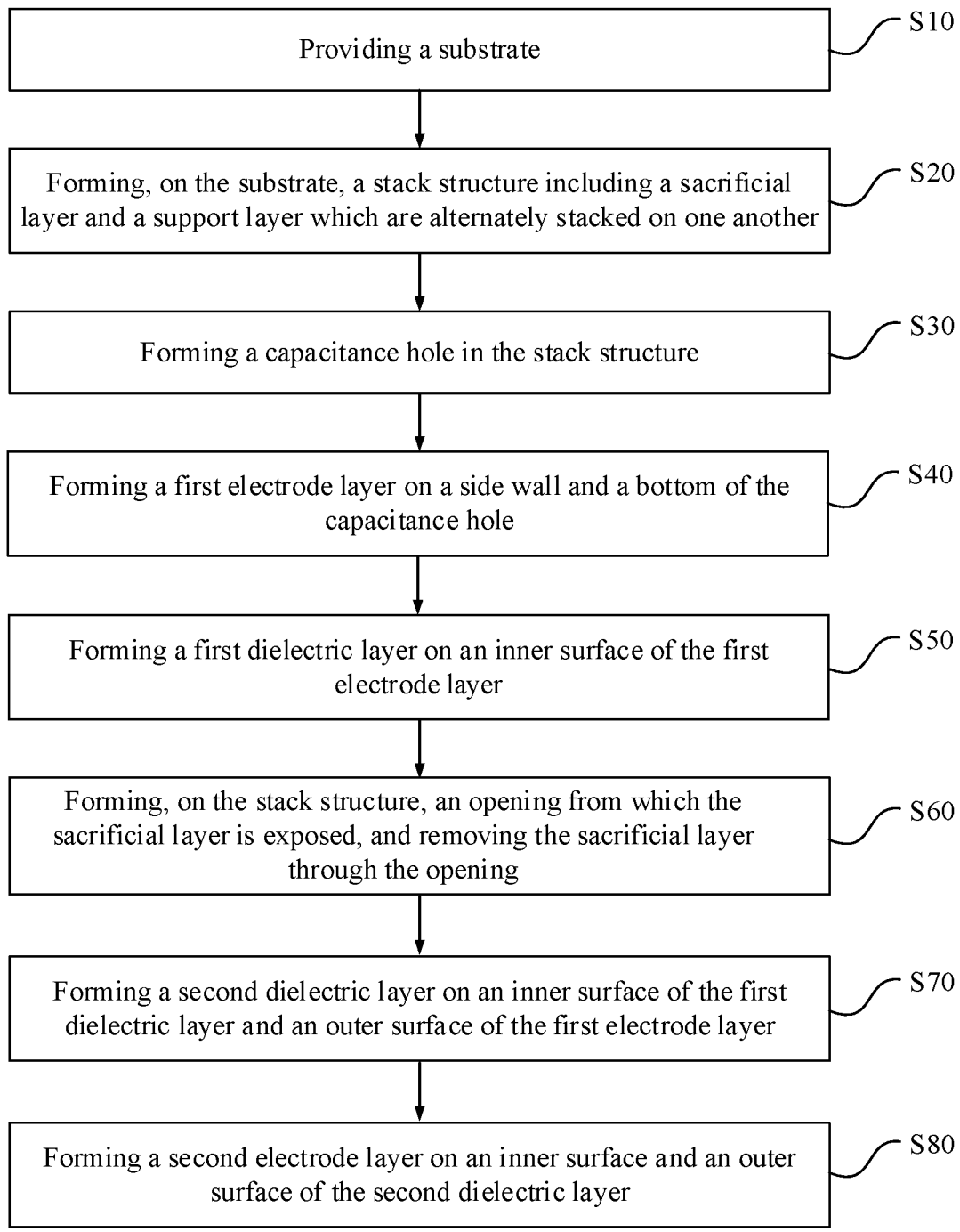
FIG. 1 is a schematic flowchart of a method for manufacturing a semiconductor structure provided in an embodiment of this disclosure.

As shown in FIG. 1, a manufacturing method for a semiconductor structure provided in an embodiment of this disclosure includes the following steps.

At S10, a substrate 21 is provided.

At S20, a stack structure including a sacrificial layer 22 and a support layer 23 which are alternately stacked on one another is formed on the substrate 21.

At S30, a capacitance hole 24 is formed in the stack structure.

At S40, a first electrode layer 25 is formed on a side wall and a bottom of the capacitance hole 24.

At S50, a first dielectric layer 26 is formed on an inner surface of the first electrode layer 25.

At S60, an opening 27 is formed on the stack structure, the sacrificial layer 22 is exposed from the opening, and the sacrificial layer 22 is removed through the opening 27.

At S70, a second dielectric layer 28 is formed on an inner surface of the first dielectric layer 26 and an outer surface of the first electrode layer 25.

The second dielectric layer includes a portion located on the inner surface of the first dielectric layer and a portion located on the outer surface of the first electrode layer.

At S80, a second electrode layer 29 is formed on an inner surface and an outer surface of the second dielectric layer 28.

The second electrode layer includes a portion located on the inner surface of the second dielectric layer and a portion located on the outer surface of the second dielectric layer.

In the method for manufacturing a semiconductor structure provided in the above embodiment, the first electrode layer is formed on the side wall and the bottom of each capacitance hole. Before the sacrificial layer is removed, the first dielectric layer is formed in advance on the inner surface of the first electrode layer. Next, the opening from which the sacrificial layer is exposed is formed on the stack structure, and the sacrificial layer is removed through the opening. The second dielectric layer is formed on the inner surface of the first dielectric layer and the outer surface of the first electrode layer. The second electrode layer is formed on the inner surface and the outer surface of the second dielectric layer. The additional introduction of the first dielectric layer increases the thickness of the second dielectric layer on an inner side of the first electrode layer, so that the sum of the thickness of a portion of the second dielectric layer that is located on an inner side of the first electrode layer and the thickness of the first dielectric layer is approximate to or equal to the thickness of a portion of the second dielectric layer that is located on the outer surface of the first electrode layer, so as to eliminate the influence of the difference in the leakage current caused by that the thicknesses of the second dielectric layer is different on inner side and outer side of the first electrode layer, which greatly improves the electrical property of the semiconductor structure.

Figure 2:
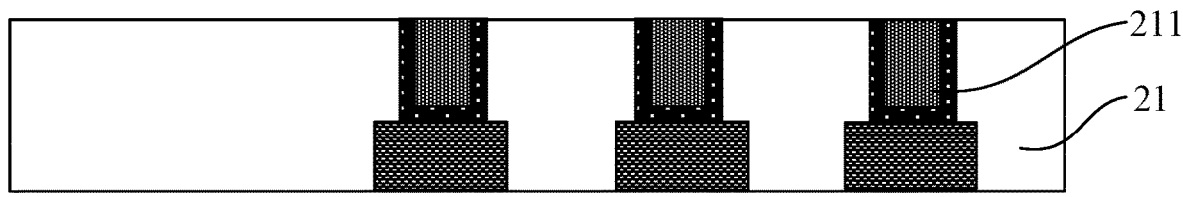
FIG. 2 is a schematic view of a local cross section of a substrate provided in an embodiment of this disclosure.

In an embodiment, as shown in FIG. 2, a storage device structure is formed in the substrate 21 provided in S10, and includes a plurality of pads 211. The storage device structure further includes a transistor word line and bitline. The pads 211 are electrically connected to a source or a drain of a transistor in the storage device structure.

As an example, the pads 211 may be arranged in a hexagonal array, which correspond to the arrangements of subsequently manufactured integrated circuit capacitor devices.

Specifically, the pads 211 are isolated from each other by spacer layers. The spacer layers can be made of any one or a combination of any two of silicon nitride (SiN), silicon oxide ($SiO_2$), and aluminum oxide ($Al_2O_3$). In this embodiment, the spacer layers can be made of SiN.

Figure 3:
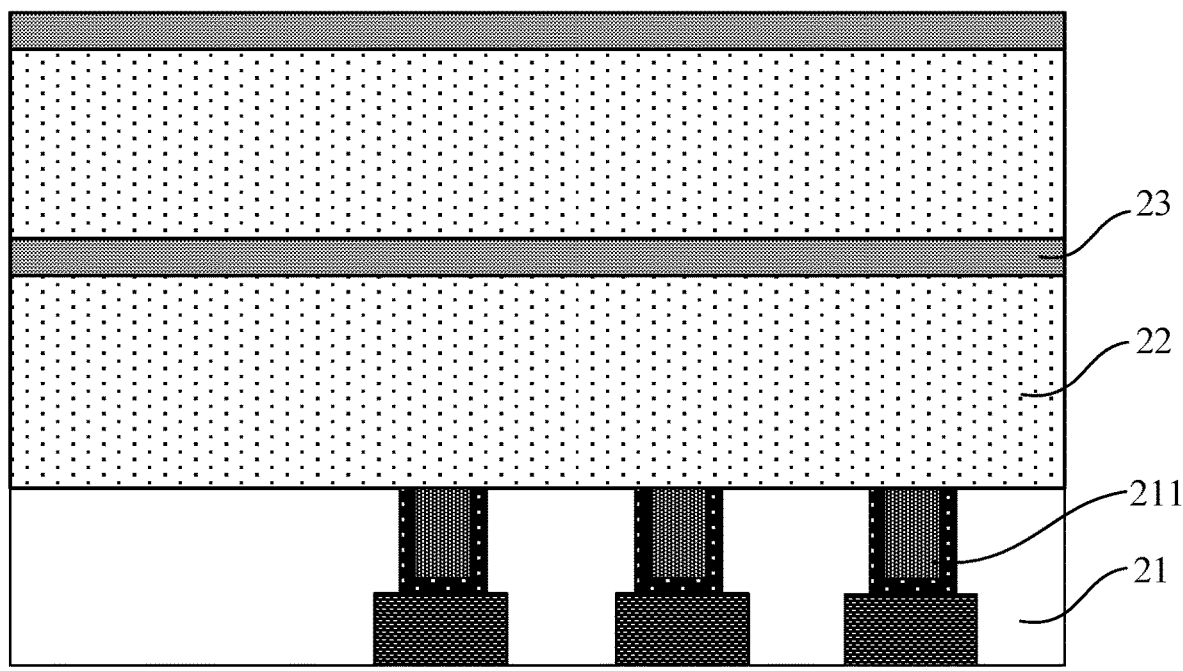
FIG. 3 is a schematic view of a part of a cross section showing a stack structure provided in an embodiment of this disclosure.

In an embodiment, as shown in FIG. 3, at S20, a stack structure including a sacrificial layer 22 and a support layer 23 which are alternately stacked on each another is formed on the substrate 21.

As an example, the sacrificial layer 22 and the support layer 23 can be formed by an atomic layer deposition process or a plasma chemical vapor deposition process.

As an example, the sacrificial layer 22 is made of the material different from the material of the support layer 23, and the etching rate of the sacrificial layer 22 is different from that of the support layer 23 in the same etching process. Specifically, the etching rate of the sacrificial layer 22 is far greater than that of the support layer 23 in the same etching process, so that when the sacrificial layer 22 is fully removed, the support layer 23 is almost fully reserved.

The sacrificial layer is preferably made of polycrystalline silicon or silicon oxide, and the support layer is preferably made of silicon nitride.

Figure 4:
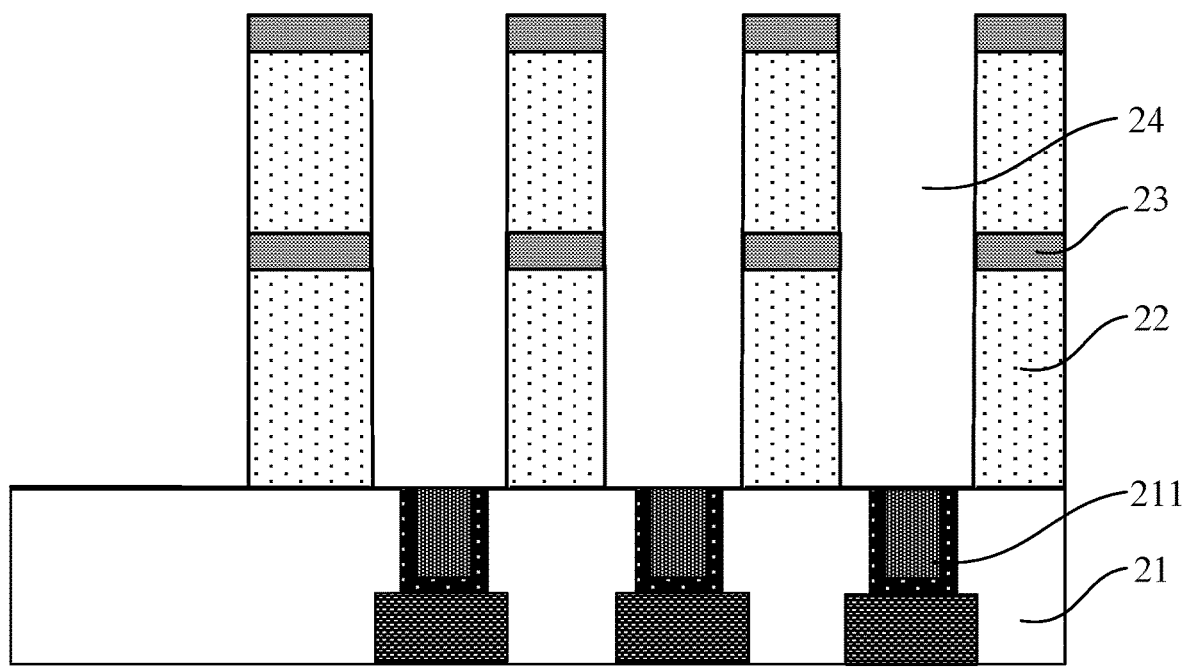
FIG. 4 is a schematic view of a part of a cross section showing a capacitance hole provided in an embodiment of this disclosure.

In an embodiment, as shown in FIG. 4, at S30, a capacitance hole 24 is formed in the stack structure. Specifically, a photoresist as a mask layer can be provided on upper surfaces of a sacrificial layer 22 and a support layer 23 which are alternately stacked on one another. A mask layer made of other materials (such as a silicon nitride hard mask layer, etc.) may be used in other examples. The mask layer is then patterned by a photo etching process to obtain a patterned mask layer for defining the capacitance hole 24. Finally, the support layer and the sacrificial layer 22 can be etched by a dry etching process, a wet etching process or a combination of the dry etching process and the wet etching process according to the patterned mask layer for defining the capacitance holes 24, so as to form the capacitance holes 24 which vertically pass through in the support layer and the sacrificial layer 22. The pads 211 at the bottom are exposed from the capacitance hole 24.

Figure 5:
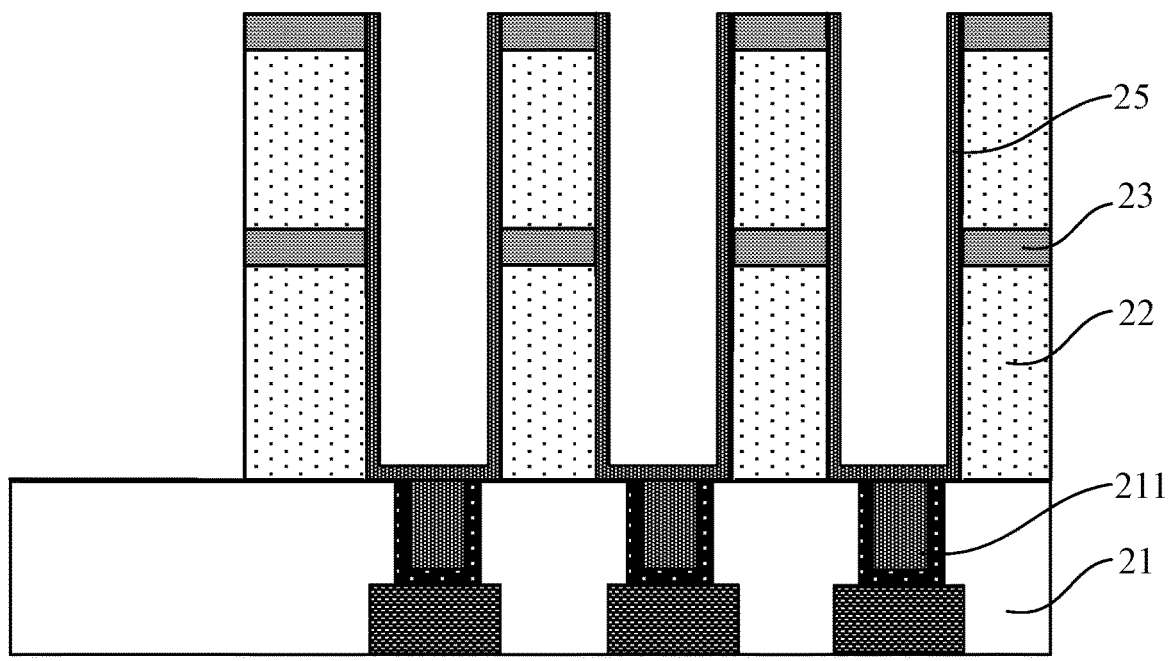
FIG. 5 is a schematic view of a part of a cross section showing a first electrode layer provided in an embodiment of this disclosure.

In an embodiment, as shown in FIG. 5, at S40, a first electrode layer 25 is formed on a side wall and a bottom of the capacitance hole 24. As an example, at first, the first electrode layer 25 is deposited on the side wall and the bottom of each capacitance hole 24 by an atomic layer deposition process or a plasma chemical vapor deposition process. Preferably, the first electrode layer 25 includes a compound formed by one or two of a metal nitride and a metal silicide, such as titanium nitride (TiN), titanium silicide, nickel silicide, and titanium silicon nitride (TiSixNy).

Figure 6:
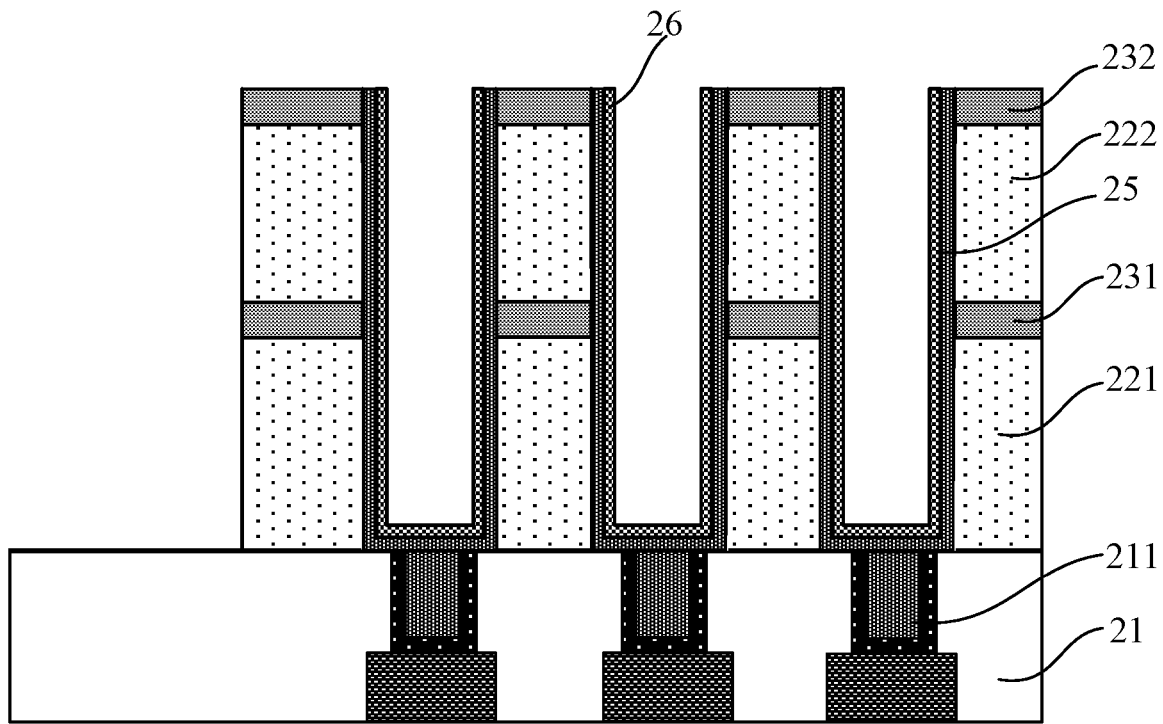
FIG. 6 is a schematic view of a part of a cross section showing a first dielectric layer on an inner surface of a first electrode layer provided in an embodiment of this disclosure.

In an embodiment, as shown in FIG. 6, at S50, a first dielectric layer 26 is formed on an inner surface of the first electrode layer 25. In an ideal state, a capacitor dielectric layer located in capacitance hole and having consistent thicknesses of inner and outer film layers should be formed on the surface of the first electrode layer by means of process technologies such as atomic layer deposition. However, due to the influence of the space environment, the difference in the thicknesses of the inner and outer film layers of the dielectric layer is significant. Therefore, before the step of removing a sacrificial layer, a first dielectric layer 26 having a thickness less than 10 Å is pre-deposited to compensate for the difference in the thickness of the subsequently formed second dielectric layer, so as to eliminate the large difference in leakage current caused by the difference in the thicknesses of the inner and outer film layers of the second dielectric layer 28, thereby obtaining uniform leakage current inside and outside the semiconductor structure, and improving the electrical property of the semiconductor structure.

In an embodiment, a first dielectric layer 26 includes any one or any combination of a niobium oxide ($Nb_2O_5$) layer, a ruthenium oxide ($RuO_2$) layer, a zirconium oxide ($ZrO_2$) layer, an aluminum oxide ($Al_2O_3$) layer, a hafnium oxide ($HfO_2$) layer, or a silicon oxide ($SiO_2$) layer. Any combination is defined as a combination of at least any two of the material layers, e.g., a combination of the niobium oxide layer and the aluminum oxide layer, or a combination of the niobium oxide layer, the aluminum oxide layer and the silicon oxide layer. All the materials are high-k dielectric materials in order to increase the capacitance value per unit area of a capacitor. The first dielectric layer and a second dielectric layer are made of the same or different materials, which is not limited in this disclosure.

Figure 7:
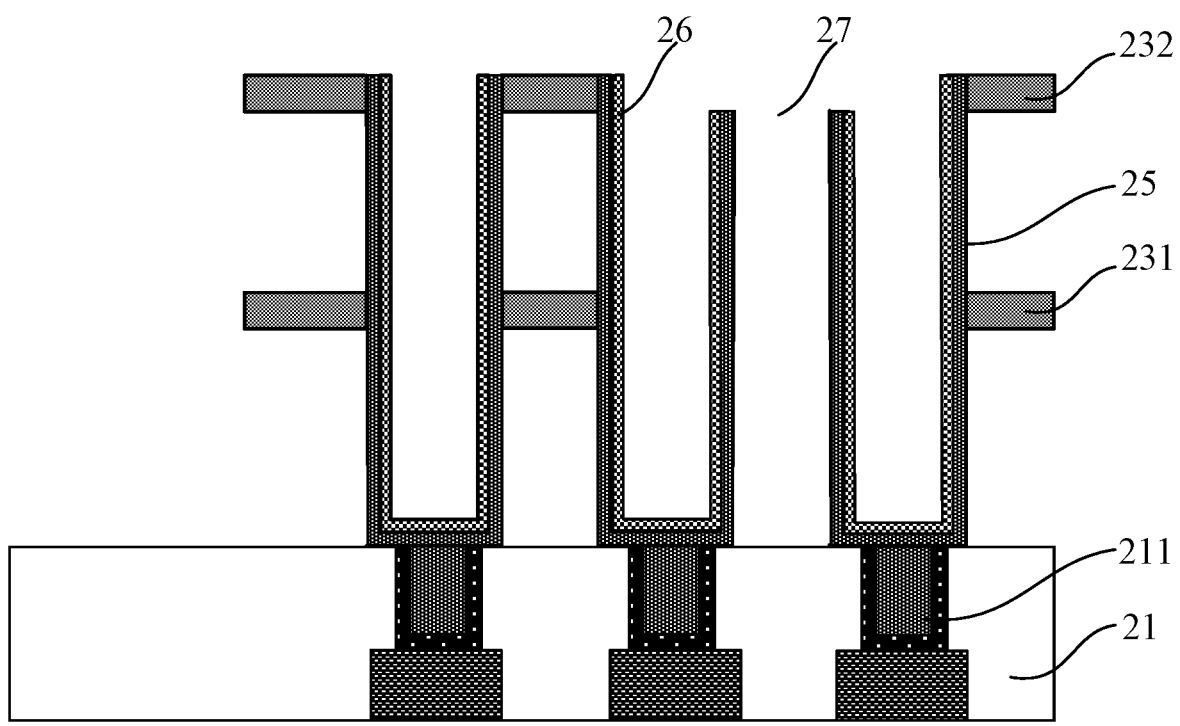
FIG. 7 is a schematic view where an opening is formed on a stack structure and a sacrificial layer is removed provided in an embodiment of this disclosure.

In an embodiment, also referring to FIG. 6, a support layer 23 includes a first support layer 231 and a second support layer 232. A sacrificial layer 22 includes a first sacrificial layer 221 and a second sacrificial layer 222. The first sacrificial layer 221, the first support layer 231, the second sacrificial layer 222, and the second support layer 232 are formed on a substrate 21 in sequence. As shown in FIG. 7, S60 of forming, on the stack structure, an opening 27 from which the sacrificial layer 22 is exposed, and removing the sacrificial layer 22 by using the opening 27, includes the followings.

At S61, a patterned mask layer is formed on an upper surface of the stack structure, the patterned mask layer has a plurality of opening patterns defining a shape and position of the opening 27.

At S62, the second support layer 232 is etched on the basis of the patterned mask layer to form, in the second support layer 232, a first opening from which the second sacrificial layer 222 located between the second support layer 232 and the first support layer 231 is exposed.

At S63, the second sacrificial layer 222 located between the second support layer 232 and the first support layer 231 is removed through the first opening.

At S64, a second opening is formed in the first support layer 231 on the basis of the first opening, and the first sacrificial layer 221 located between the first support layer 231 and the substrate 21 is exposed from the second opening.

At S65, the first sacrificial layer 221 located between the first support layer 231 and the substrate 21 is removed, so that a part of a first electrode layer 25 and a first dielectric layer 26 is exposed.

Figure 8:
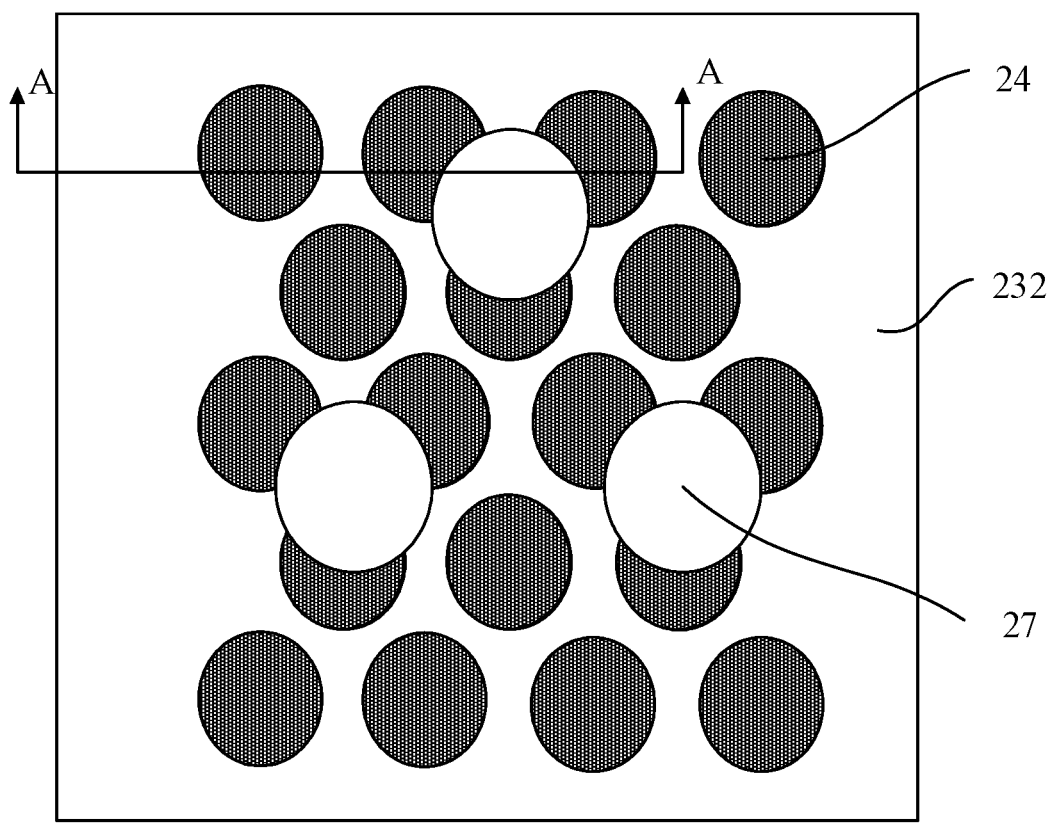
FIG. 8 is a top view of a semiconductor structure obtained by removing a sacrificial layer, where a schematic view of a part of a cross section along the direction AA' is illustrated in FIG. 7.

As an example, one opening 27 overlaps only one capacitance hole 24 or one opening 27 overlaps a plurality of capacitance holes 24 at the same time (in the example shown in FIG. 8, one opening 27 overlaps three capacitance holes 24), which is not limited in this disclosure.

As an example, the first sacrificial layer 221 and the second sacrificial layer 222 may be removed by a wet etching process. A solution used in the wet etching may be a mixed solution of dilute hydrofluoric acid (DHF) and ammonia ($NH_4OH$). At the room temperature, the concentration of the dilute hydrofluoric acid is 100:1-500:1. The solution for wet etching may also be a mixed solution of dilute hydrofluoric acid and tetramethylammonium hydroxide (TMAH). The concentration of tetramethylammonium hydroxide may be 1%-10% at a room temperature of 35° C.-65° C.

As an example, the first sacrificial layer and the second sacrificial layer can be made of the same material, e.g., polycrystalline silicon or silicon oxide. The first sacrificial layer and the second sacrificial layer may also be made of different materials. For example, the first sacrificial layer is made of polycrystalline silicon, and the second sacrificial layer is made of silicon oxide. The first support layer and the second support layer are both made of silicon nitride.

Figure 9:
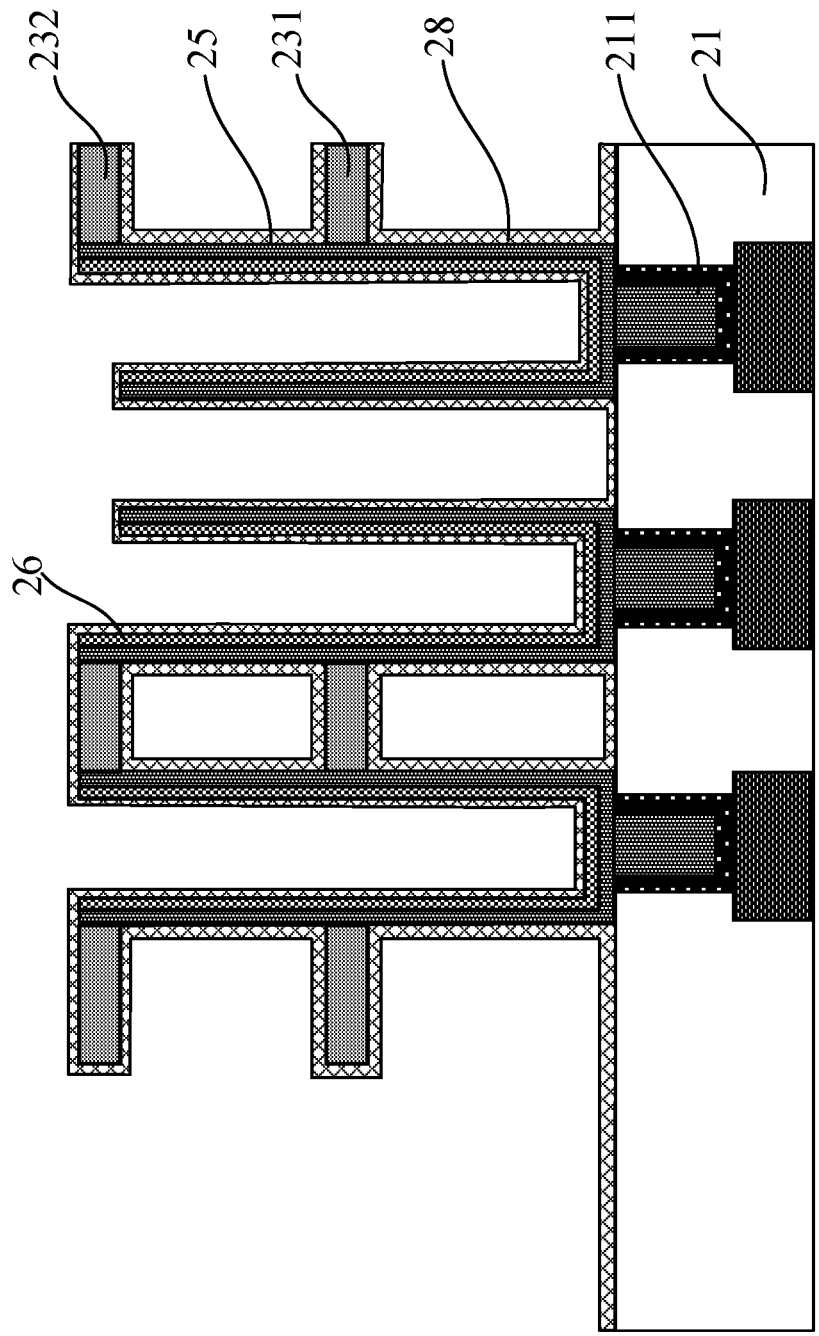
FIG. 9 is a schematic view of a part of a cross section showing a second dielectric layer provided in an embodiment of this disclosure.

In an embodiment, as shown in FIG. 9, at S70, a second dielectric layer 28 is formed on an inner surface of the first dielectric layer 26 and an outer surface of the first electrode layer 25.

As an example, the second dielectric layer 28 can be made of a high-k dielectric material in order to increase the capacitance value per unit area of a capacitor. The second dielectric layer includes one of ZrOx, HfOx, ZrTiOx, RuOx, SbOx and AlOx, or a stack formed by two or more material selected from the group consisting of the above materials.

Figure 10:
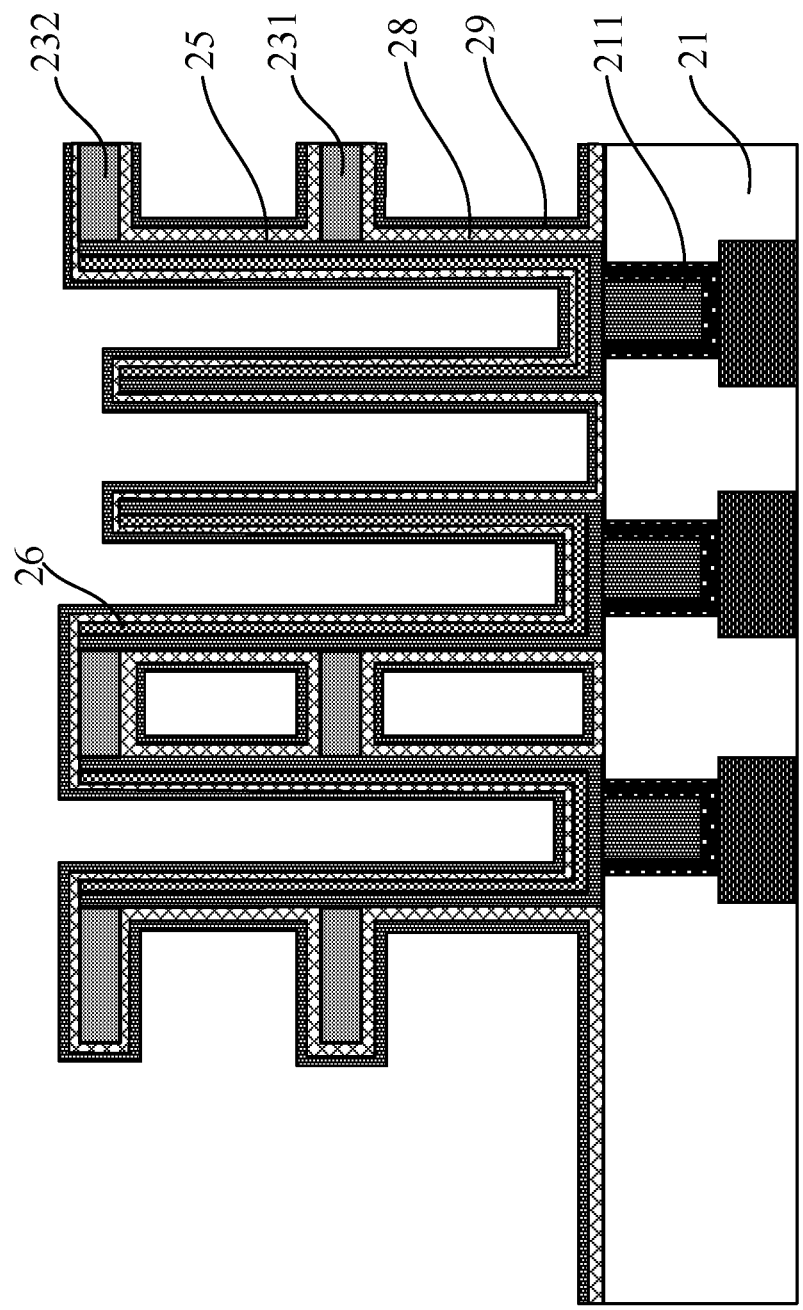
FIG. 10 is a schematic view of a part of a cross section showing a second electrode layer provided in an embodiment of this disclosure.

In an embodiment, as shown in FIG. 10, at S80, a second electrode layer 29 is formed on an inner surface and an outer surface of the second dielectric layer 28.

As an example, the second electrode layer 29 may be made of one of tungsten, titanium, nickel, aluminum, platinum, titanium nitride (TiN), N-type polycrystalline and P-type polycrystalline, or may be made of a stack formed by two or more material selected from the group consisting of the above materials. The preparation process of the second electrode layer 29 is the same as that of a first electrode layer 25, and will not be described here in detail again.

In an embodiment, the thickness of a portion of a second dielectric layer 28 that is located on an inner surface of a first dielectric layer 26 is less than that of a portion of the second dielectric layer 28 that is located on an outer surface of a first electrode layer 25. Specifically, there is a gap on an inner side of the second dielectric layer 28 in capacitance hole 24, so as to store the capacitor.

In an embodiment, the thickness of a first dielectric layer 26 ranges from 2 Å to 10 Å (angstrom), and the thickness of a second dielectric layer 28 ranges from 40 Å to 70 Å. Specifically, the thickness of the first dielectric layer 26 may be 2 Å, 3 Å, 4 Å, 5 Å, 6 Å, 7 Å, 8 Å, 9 Å, or 10 Å, etc., and the thickness of the second dielectric layer 28 may be 40 Å, 45 Å, 50 Å, 55 Å, 60 Å, 65 Å, or 70 Å, etc. The thickness of the first dielectric layer 26 is lower than 10 Å, so that the sum of the thickness of the first dielectric layer 26 and the thickness of a portion of the second dielectric layer that is located on an inner side of a first electrode layer is approximate to or equal to the thickness of a portion of the second dielectric layer that is located on an outer surface of the first electrode layer 25. Thus, a leakage current between the first electrode layer 25 and a portion of the second electrode layer 29 on an inner surface of the second dielectric layer 28 is equal to a leakage current between the first electrode layer 25 and a portion of the second electrode layer 29 on an outer surface of the second dielectric layer 28, so as to eliminate the influence of the difference in the leakage current on the second dielectric layer 28.

Also referring to FIG. 10, a semiconductor structure provided in an embodiment of this disclosure includes: a substrate 21 on which a first electrode layer 25 is located; a first dielectric layer 26 covering an inner surface of the first electrode layer 25; a second dielectric layer 28 covering an inner surface of the first dielectric layer 26 and an outer surface of the first electrode layer 25; and a second electrode layer 29 covering an inner surface and an outer surface of the second dielectric layer 28.

As an example, a storage device structure including a plurality of pads 211 is formed in the substrate 21. The storage device structure further includes a transistor word line and bitline. The pads 211 are electrically connected to a source of a transistor in the storage device structure.

In an embodiment, a leakage current between a first electrode layer 25 and a portion of a second electrode layer 29 that is located on an inner surface of a second dielectric layer 28 is equal to a leakage current between the first electrode layer 25 and a portion of the second electrode layer 29 that is located on an outer surface of the second dielectric layer 28.

In an embodiment, a first dielectric layer 26 includes any one or any combination of a niobium oxide ($Nb_2O_5$) layer, a ruthenium oxide ($RuO_2$) layer, a zirconium oxide ($ZrO_2$) layer, an aluminum oxide ($Al_2O_3$) layer, a hafnium oxide ($HfO_2$) layer, or a silicon oxide ($SiO_2$) layer.

In an embodiment, the thickness of a first dielectric layer 26 ranges from 2 Å to 10 Å, and the thickness of a second dielectric layer 28 ranges from 40 Å to 70 Å. Specifically, the thickness of the first dielectric layer 26 may be 2 Å, 3 Å, 4 Å, 5 Å, 6 Å, 7 Å, 8 Å, 9 Å, or 10 Å, etc., and the thickness of the second dielectric layer 28 may be 40 Å, 45 Å, 50 Å, 55 Å, 60 Å, 65 Å, or 70 Å, etc.

In an embodiment, the thickness of a portion of the second dielectric layer 28 that is located on an inner surface of a first dielectric layer 26 is less than that of a portion of the second dielectric layer 28 that is located on an outer surface of a first electrode layer 25.

In an embodiment, referring to FIG. 7, a semiconductor structure further includes: a support layer 23 located on a substrate 21 and including a first support layer 231 and a second support layer 232 arranged to be spaced apart from each other; and an opening 27 located at a top of a first electrode layer 25 and a first dielectric layer 26. Specifically, a bottom of the opening 27 is lower than that of the second support layer 232 so as to increase the removal rate of a sacrificial layer and the formation rate of the subsequently formed second dielectric layer 28 and second electrode layer 29.

A memory provided in an embodiment of this disclosure includes the semiconductor structure.

The embodiments of the present description are described in a progressive manner, and each embodiment focuses on illustrating differences from one another. Mutual references may be made to the same or similar portions among these embodiments.

Technical features of the foregoing embodiments may be randomly combined. To make description concise, not all possible combinations of the technical features in the foregoing embodiments are described. However, the combinations of these technical features shall be considered as falling within the scope recorded by this specification provided that no conflict exists.

The foregoing embodiments only describe several implementations of this disclosure specifically and in detail, but cannot be construed as a limitation to the patent scope of this disclosure. It is to be noted that for a person of ordinary skill in the art, several transformations and improvements can be made without departing from the idea of this disclosure. These transformations and improvements belong to the protection scope of this disclosure. Therefore, the scope of protection of this patent application should be determined by the appended claims.

What is claimed is:

1. A manufacturing method for a semiconductor structure, comprising:
   providing a substrate;
   forming, on the substrate, a stack structure comprising a sacrificial layer and a support layer which are alternately stacked on one another;
   forming a capacitance hole in the stack structure;
   forming a first electrode layer on a side wall and a bottom of the capacitance hole;
   forming a first dielectric layer on an inner surface of the first electrode layer;
   forming, on the stack structure, an opening form which the sacrificial layer is exposed, and removing the sacrificial layer through the opening;
   forming a second dielectric layer on an inner surface of the first dielectric layer and an outer surface of the first electrode layer; and
   forming a second electrode layer on an inner surface and an outer surface of the second dielectric layer;
   wherein a thickness of the first dielectric layer ranges from 2 Å to 10 Å, and a thickness of the second dielectric layer ranges from 40 Å to 70 Å;
   wherein a thickness of a portion of the second dielectric layer located on the inner surface of the first dielectric layer is less than that of a portion of the second dielectric layer located on the outer surface of the first electrode layer;
   wherein a leakage current between the first electrode layer and a portion of the second electrode layer located on the inner surface of the second dielectric layer is equal to a leakage current between the first electrode layer and a portion of the second electrode layer located on the outer surface of the second dielectric layer.

2. The method of claim 1, wherein the first dielectric layer comprises any one of or any combination of a niobium oxide layer, a ruthenium oxide layer, a zirconium oxide layer, an aluminum oxide layer, a hafnium oxide layer or a silicon oxide layer.

3. The method of claim 1, wherein the support layer comprises a first support layer and a second support layer; the sacrificial layer comprises a first sacrificial layer and a second sacrificial layer; the first sacrificial layer, the first support layer, the second sacrificial layer, and the second support layer are formed on the substrate in sequence;
   the forming, on the stack structure, an opening form which the sacrificial layer is exposed, and removing the sacrificial layer through the opening comprises:

forming a patterned mask layer on an upper surface of the stack structure, wherein the patterned mask layer has a plurality of opening patterns defining a shape and position of the opening;

etching the second support layer on the basis of the patterned mask layer, to form, in the second support layer, a first opening from which the second sacrificial layer located between the second support layer and the first support layer is exposed;

removing, through the first opening, the second sacrificial layer located between the second support layer and the first support layer;

forming, in the first support layer, a second opening on the basis of the first opening, wherein the first sacrificial layer located between the first support layer and the substrate is exposed from the second opening; and removing the first sacrificial layer located between the first support layer and the substrate.

4. The method of claim 3, wherein a part of the first electrode layer and a part of the first dielectric layer are exposed form the opening pattern.

5. A semiconductor structure, comprising:
a substrate;
a first electrode layer located on the substrate;
a first dielectric layer covering an inner surface of the first electrode layer;
a second dielectric layer covering an inner surface of the first dielectric layer and an outer surface of the first electrode layer; and
a second electrode layer covering an inner surface and an outer surface of the second dielectric layer;
wherein a thickness of the first dielectric layer ranges from 2 Å to 10 Å, and a thickness of the second dielectric layer ranges from 40 Å to 70 Å;
wherein a thickness of a portion of the second dielectric layer located on the inner surface of the first dielectric layer is less than that of a portion of the second dielectric layer located on the outer surface of the first electrode layer;
wherein a leakage current between the first electrode layer and a portion of the second electrode layer located on the inner surface of the second dielectric layer is equal to a leakage current between the first electrode layer and a portion of the second electrode layer located on the outer surface of the second dielectric layer.

6. The semiconductor structure of claim 5, wherein the first dielectric layer comprises any one or any combination of a niobium oxide layer, a ruthenium oxide layer, a zirconium oxide layer, an aluminum oxide layer, a hafnium oxide layer or a silicon oxide layer.

7. The semiconductor structure of claim 5, further comprising:
a support layer located on the substrate and comprising a first support layer and a second support layer arranged to be spaced apart from each other; and
an opening located at a top of the first electrode layer and the first dielectric layer.

8. The semiconductor structure of claim 7, wherein a bottom of the opening is lower than that of the second support layer.

9. A memory, comprising a semiconductor structure, wherein the semiconductor structure comprises:
a substrate;
a first electrode layer located on the substrate;
a first dielectric layer covering an inner surface of the first electrode layer;
a second dielectric layer covering an inner surface of the first dielectric layer and an outer surface of the first electrode layer; and
a second electrode layer covering an inner surface and an outer surface of the second dielectric layer;
wherein a thickness of the first dielectric layer ranges from 2 Å to 10 Å, and a thickness of the second dielectric layer ranges from 40 Å to 70 Å;
wherein a thickness of a portion of the second dielectric layer located on the inner surface of the first dielectric layer is less than that of a portion of the second dielectric layer located on the outer surface of the first electrode layer;
wherein a leakage current between the first electrode layer and a portion of the second electrode layer located on the inner surface of the second dielectric layer is equal to a leakage current between the first electrode layer and a portion of the second electrode layer located on the outer surface of the second dielectric layer.

* * * * *